(12) United States Patent
Vazquez Carazo

(10) Patent No.: US 7,075,217 B2
(45) Date of Patent: *Jul. 11, 2006

(54) LAMINATED PIEZOELECTRIC TRANSFORMER

(75) Inventor: Alfredo Vazquez Carazo, Norfolk, VA (US)

(73) Assignee: Face International Corp, Norfolk, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/410,371

(22) Filed: Apr. 9, 2003

(65) Prior Publication Data

US 2004/0201328 A1   Oct. 14, 2004

(51) Int. Cl.
*H02N 2/00*   (2006.01)
(52) U.S. Cl. .................. 310/359; 310/357; 310/358
(58) Field of Classification Search ........... 310/359, 310/358, 357, 366, 365
See application file for complete search history.

(56) References Cited

U.S. PATENT DOCUMENTS 6,037,706 A * 3/2000 Inoi et al. .................. 310/359
6,326,718 B1 * 12/2001 Boyd ........................ 310/359

* cited by examiner

*Primary Examiner*—Darren Schuberg
*Assistant Examiner*—J. Aguirrechea
(74) *Attorney, Agent, or Firm*—David J. Bolduc

(57) ABSTRACT

A laminated piezoelectric transformer is provided using the longitudinal vibration modes for step-up voltage conversion applications. The input portions are polarized to deform in a longitudinal plane and are bonded to an output portion. The deformation of the input portions is mechanically coupled to the output portion, which deforms in the same longitudinal direction relative to the input portion. The output portion is polarized in the thickness direction relative its electrodes, and piezoelectrically generates a stepped-up output voltage.

17 Claims, 7 Drawing Sheets

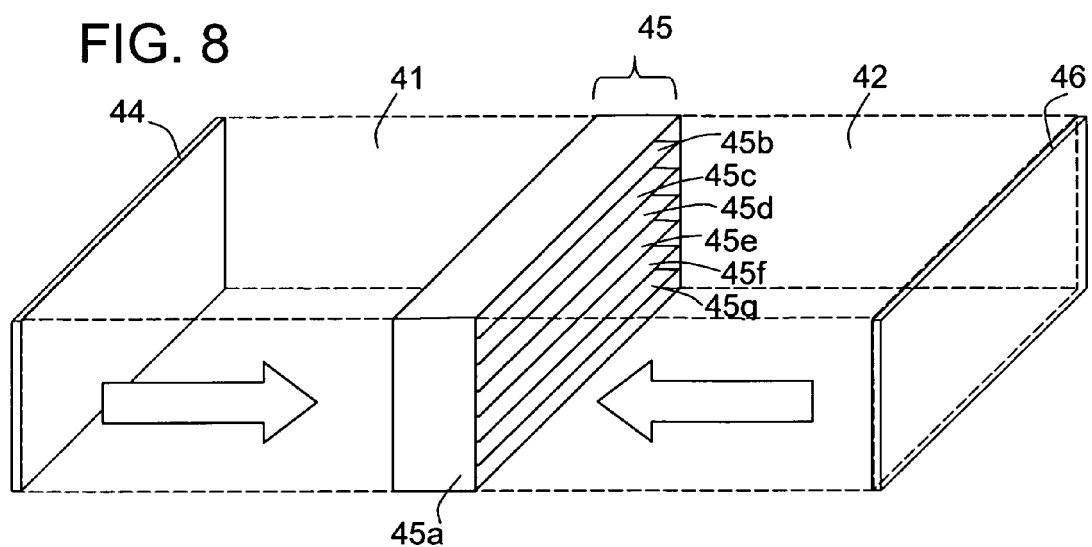

LAMINATED PIEZOELECTRIC TRANSFORMER

This invention was made with government support under SBIR contract Case Number NAS3-02023 SBIR 2001-I awarded by the national Aeronautics and Space Administration (NASA). The U.S. Government has certain rights in the invention.

BACKGROUND OF INVENTION

1. Field of Invention

The present invention relates generally to laminated piezoelectric ceramic transformers for power transfer circuits. More specifically, the present invention relates to a laminated piezoelectric transformer having a symmetric structure consisting of two multi-layer input sections which are bonded to on the upper and lower surfaces of a centrally poled output section, as well as electrode configurations for efficiently tapping the input and output portions.

2. Description of the Prior Art

Wire wound-type electromagnetic transformers have been used for generating high voltage in internal power circuits of devices such as televisions, fluorescent lamp ballasts, CCFL backlighting, and others. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. In addition to being large in size and weight, wound transformers create EMI which can disrupt the performance of other circuits and components in proximity to the transformer, which is a major issue in compact portable devices having a multitude of circuitry in a small packing area, such as laptop computers, PDA's, camcorders, and other handheld devices. Furthermore, in view of high frequency applications and compact size application, the electromagnetic transformer has many disadvantages related to the materials used in their manufacturing. Magnetic materials used for the cores of transformers have two types of electrical losses, eddy current loss due to finite electrical conductivity and hysteresis (magnetic) loss. A third type of loss is related to the windings of the transformer. These windings are made from copper wire, which copper losses include not only DC resistance loss, and additional ohmic loss caused by non-uniform current density concentrations arising from the proximity effect and skin effect. These losses, specifically hysteresis and skin effect losses increase in high frequency applications and force the designing engineer to over-design the magnetic components which, in turn, affects the final size. Furthermore,-wire-wound transformers also require winding isolation material, which also affects the final size of the component. This is even a bigger issue in high voltage transformers where dielectric breakdown risk between high voltage and low voltage wiring limits the minimum thickness of the isolation material used. Furthermore, the maximum permissible temperature of a transformer is approximately 100° C. and is limited by both magnetic material and winding isolation material considerations. This temperature limit along with the surface-to-ambient thermal resistance of the component limit the average power dissipation density (W/cm$^3$) in the component. This power dissipation density limit translates into a maximum current density limit in the copper winding and a maximum peak AC flux density in the core material, and thus in the maximum power density that the wire-wound transformer can supply.

To remedy this and many other problems of wire-wound transformers, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and dimensions and shape of materials of construction of the transformer including the piezoelectric ceramics and electrodes. Furthermore, PTs have a number of advantages over general electromagnetic transformers. The size of PTs can be made much smaller than electromagnetic transformers of comparable transformation ratio, PTs are nonflammable, and produce no electromagnetically induced noise.

Piezoelectric transformer technology has evolved around three fundamentally different PT families: "Rosen-type" PTs, "Thickness-type" PTs, and "Laminated-type" PTs. Rosen-type PTs were the first PTs developed and are characterized by a common area for the input and the output section corresponding to the transversal area of the ceramic body. This area is typically transverse to the propagation direction of the acoustic standing front-wave. Furthermore, the input to output coupling area is also, typically, the nodal area of the PT, i.e., the area with no deformation and higher stress levels. Rosen-PTs have been proposed in rectangular, circular, or annular shapes. Thickness-type PTs make use of discs or plates vibrating in the thickness mode. In these PTs, the coupling areas between the input and the output are the major surfaces of the input and output sections. In these PTs, the nodal point is established in the coupling area. In laminated-type PTs the input and output are also acoustically coupled at their major surfaces. However, in these types of PTs the nodal point does not separate the input from the output section. The coupling area between input and output is NOT a nodal area of the PT, but it moves with the vibration of the PT.

The basic Rosen-type piezoelectric transformer was disclosed in U.S. Pat. No. 2,830,274 and numerous variations of this basic apparatus are well known in the prior art. The typical Rosen-type PT comprises a flat ceramic slab 20 appreciably longer than it is wide and substantially wider than it is thick. Rosen-type PTs have been proposed in various forms and configurations, including rings, flat slabs and the like as disclosed in U.S. Pat. No. 2,830,274 (1958) by C. Rosen el al., U.S. Pat. No. 3,562,792 (1971) and U.S. Pat. No. 3,764,848 (1973) both by D.Berlincourt, U.S. Pat. No. 4,767,967 (1988) by Tanaka et al, U.S. Pat. No. 5,736,807 by Hakamata et al., and others. Typical examples of a prior Rosen-type PTs are illustrated in FIGS. 1 and 2. In the case of FIG. 1, the piezoelectric body 20 is in the form of a flat slab that is considerably wider than it is thick, and having greater length than width.

As shown in FIG. 1, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the face of the slab (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode (d31 mode). The transverse effect mode vibration in the low impedance vibrator portion 21 in turn excites a vibration in the high impedance generator portion 22 in a longitudinal effect longitudinal vibration mode (g33 mode). As the result, high voltage output is obtained between electrode 28 and 35. Typically, Rosen-type PTs are designed to operate under half wavelength (lambda/2) or three half wavelength (3×lambda/2). The total length of the PT of FIG. 1 determine the value of the operational resonance frequency of the PT.

An inherent problem of such prior Rosen-PTs is that they have relatively low power transmission capacity. This disadvantage of prior PTs relates to the fact that little or no mechanical advantage is realized between the vibrator portion 21 of the device and the driver portion 22 of the device. Because the driver and vibrator portions each is intrinsically a part of the same electroactive member, the transmission of energy between portions is limited to the transverse area of the longitudinal body. This inherently restricts the mechanical energy transmission capability of the device, which, in turn, inherently restricts the electrical power handling capacity of such devices.

A second problem of Rosen-PTs, such the one of FIG. 1, is the non-symmetric structure in the length direction. Since the polarization direction in ceramic piezoelectric materials relies significantly on the material properties, such as in the stiffness, dielectric permitivity, and piezoelectric properties, the mechanical behavior of the Rosen-PT will not be mechanically symmetrical in the length direction. As a result, Rosen-PTs show spurious bending resonances around the main resonance frequency, specifically when thin bodies are used. This bending resonance may interfere with the main resonance of the PT and thus diminish the efficiency of the PTs. Additionally, the spurious bending resonance may affect the tracking circuitry of the Rosen-PT and may render the PT useless in practice.

Additionally, since the transmitted power density is limited by the strain endurance of the piezoelectric material, Rosen-type PTs are limited in power to the maximum permissible tensile stresses in the nodal transversal area, which is typically very small. As consequence of this, Rosen-PTs become mechanically weak and may suffer fracture in the nodal transversal area.

Another problem with prior Rosen PTs is that the input and output capacitances depend upon the total dimension of the ceramic bar used. Once the dimensions of the slab are selected, the value of the output capacitance design is fixed since it depends on the thickness of the bar and the half of the total length of the bar for Rosen-type PT operating in the lambda-half mode.

Another drawback of conventional Rosen-type PTs is that since the electrode of the high voltage section is located in the loop of vibration, i.e., in the vibrating direction, connection of the external terminals adversely affects vibration or largely degrades reliability.

The second family of PTs is the "Thickness-type PT", which are PTs polarized and vibrating in the thickness direction (i.e., vibrations are parallel to the direction of polarization of the layers). Illustrative of such thickness mode vibration PTs is the device of U.S. Pat. No. 5,118,982 to Inoue shown in FIG. 3. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT of FIG. 3 comprises a low impedance vibrator portion 11 including a plurality of piezoelectric layers 211 through 214 and a high impedance vibrator portion 12 including a piezoelectric layer 222, each of the layers being integrally laminated, and caused to vibrate in thickness-extensional mode. The low impedance portion 11 has a laminated structure which comprises multilayered piezoelectric layers 211 through 214 each being interposed between electrodes including the top surface electrode layer 201 and internal electrode layers 231 through 234. The high impedance portion 12 is constructed of the bottom electrode layer 202, an internal electrode layer 234 and a single piezoelectric layer 122 interposed between both electrode layers 202 and 234. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness. The PT has a common electrode 234 to which one terminal 16 of each portion is connected. The total thickness of the PT of FIG. 3 is restricted to a half wavelength (lambda/2) or one full wavelength (lambda) of the drive frequency.

When an alternating voltage is applied to the electrode layers across the ceramic layer of the vibrator portion 11, a vibration is excited in the ceramic parallel to the direction of the polarization of the layers in the longitudinal vibration mode (d33 mode). This vibration of the low impedance portion 11 excites a vibration (g33 mode) in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode with a resonance of lambda/2 mode (both end free fundamental mode) or lambda mode (both end-free secondary mode), the PT may operate in a frequency range of 1–10 MHz.

Referring now to FIG. 4: It is characteristic of PTs that they preferably vibrate in a resonant mode predominantly along one plane or direction (i.e., radial or longitudinal planes, and thickness or longitudinal directions). A problem occurs with PTs when the ratio between the longitudinal or radial dimension is close to the thickness dimension. When the ratio between the height H and the radius R of the PT are close to unity, then radial or longitudinal mode resonant frequency and thickness mode resonant frequency are also close to each other. When the resonant frequencies are very close to each other, then the vibrations interfere with each other. This leads to aberrant vibrational modes that reduce the efficiency of these PTs.

An inherent problem with prior thickness mode PTs is that the thickness mode resonant frequency is too high for some applications. Although the high frequency operation initially promotes higher power efficiency, the power loss generated by circulating current in the PT decreases significantly the PT efficiency and consequently increases the heat generation, limiting the maximum power available.

Another problem with prior thickness mode PTs is the losses affecting the driving switching inverter used to drive them, which limit the application of these PTs to high power applications.

Another problem with prior thickness mode PTs is their limitation to reach high output voltages, due to their thin thickness and low output impedance, which leaves them out of the scope of the present invention.

The third family of PTs are the "Laminate-type PTs". Two types of laminated-type PTs have been so far disclosed in the prior art: Step-down laminated PTs, and Step-up laminated PTs. In the first type, Step-down laminated-type PTs, the input portion (driver section) has a higher impedance (lower capacitance) than the output portion (generator section). Thus, the output voltage of the transformer has a lower value that the input voltage applied to the driver section. Illustrative of such step-down laminated PTs is the device disclosed in U.S. Pat. No. 5,834,882 to Bishop (1998), U.S. Pat. No. 6,333,589 (2001) to Inoi.

This type of Step-down laminated PT suffer of the major drawback that they cannot be used for generating high output voltages, which put them out of the scope of the present invention.

The second category of Laminated PTs correspond to the Step-up Laminated PTs. Illustrative of such laminated PTs is the device of U.S. Pat. No. 6,326,718 (2001) to Boyd, shown in FIG. 5. A laminated PT typically comprises a high impedance portion 60 and a low impedance portion 40 stacked on each other. The remainder of the slab, the vibrator portion 21 is polarized transversely to the plane of the face of the slab (in the thickness direction) and has a high impedance in the direction of polarization. The high impedance portion 60 is polarized in the thickness direction, The high impedance portion 40 is divided in two parts by a belt electrode printed in the center of the slab. Each portion 41 and 42 is polarized in the longitudinal direction.

In the arrangement illustrated in FIG. 5, a voltage applied between the electrodes of the low impedance portion 60 is stepped up to a higher voltage between the electrodes of the high impedance portion 40. The applied voltage causes a deformation of the slab through proportionate changes in the x-y and y-z surface areas. These changes are transmitted toward the high impedance portion 60. A longitudinal vibration is thereby excited in the low impedance vibrator portion 60 in the transverse effect mode (d31 mode). The transverse effect mode vibration in the low impedance vibrator portion 60 in turn excites a vibration in the high impedance generator portion 40 in a longitudinal effect longitudinal vibration mode (g33 mode). As the result, high voltage output is obtained between the electrodes of the high impedance portion 40.

An inherent problem with prior laminated PTs is that the embodiment has a non-symmetric structure with respect to the thickness direction. As a result, several spurious bending resonant modes are excited around the main longitudinal vibration mode. These bending mode diminished the efficiency of the PT.

Another problem of previous laminated PTs is the use of surface belt central electrode in the high impedance section. This surface electrode complicates the polarization process of the samples.

Another problem of the previous laminated PTs is the high level of failure due to the separation of the interface bonding layer joining input and output portions due to the spurious bending modes.

Another problem of the previous laminated PTs is that the acoustic transmission occurs between only one of the major surfaces of the transformer, thus leading to a limitation in the maximum power transmission reachable.

Accordingly, it would be desirable to provide a piezoelectric transformer design that has a higher step-up ratio capacity than similarly sized prior piezoelectric transformers.

It would also be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer that is a low profile (height to length ratio) as compared to prior piezoelectric and magnetic transformers that have similar step-up voltage and power transmission capacities.

It would also be desirable to provide a piezoelectric transformer with a symmetric design thereby reducing spurious bending vibration modes.

It would also be desirable to provide a piezoelectric transformer with a significant difference between dimensions in thickness, width and longitudinal dimensions thereby focusing the main resonant vibration mode in the longitudinal direction.

It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device, thereby making the PT more robust and enhancing the acoustic coupling between input and output sections.

It would also be desirable to provide a piezoelectric transformer having electrode connections that do not effect the resonant operation of the PT.

It would also be desirable to provide a piezoelectric transformer having a configuration minimizing the amount of exposed surfaces having high voltage.

It would be desirable to provide a piezoelectric transformer having a configuration that allow the design of the input and output capacitance with wide freedom.

SUMMARY OF THE INVENTION

According to the present invention, there is provided a piezoelectric transformer (PT) preferably operating at its natural (i.e. "resonant") frequency to convert a transformer input signal of a first character (i.e. voltage, frequency and current) to a transformer output signal of a second character (i.e. voltage, frequency and current). The disclosed PT efficiently accomplishes the described signal conversion by subjecting the input "driver" sections of the PT to an alternating voltage (or in certain embodiments a pulsed voltage) which causes the input portion(s) to deform and vibrate, which in turn causes the output portion(s) to vibrate, which in turn causes the "driven" output portion of the PT to deform, and which in turn generates an output voltage at the driven section of the transformer.

The preferred embodiment of the invention provides a laminated piezoelectric transformer PT. The PT has first and second bar-shaped input piezoelectric portions, each of which is bonded on one of its major faces to first and second insulation layers. The input portions each comprise multiple thin layers with internal electrodes as well as external electrodes on both major faces. The electrodes are connected alternatively by means of two external electrodes in the length edge of the bar. The input portions are poled between the electrodes perpendicular to the input layer's major faces (in the thickness direction). This polarization process creates internal polarization in the internal multiple thin layers being the direction of polarization opposite to the following layer. As a result, the internal layers are connected in parallel. Application of an alternating voltage causes the input portions to expand and contract in the transverse direction to the poling direction depending on the polarity of the voltage.

The output portion of the PT comprises another bar-shaped layer of PZT bonded along both major faces to the other side of the insulator layers. The output portion comprises multiple thin layers, each of which has a central printed electrode having a width significantly smaller than the total length of the output bar. The multiple layers are sintered together and two opposing electrodes are printed on two opposing minor faces. A central ring electrode is made by connecting the multiple internal electrodes in the central area of the PT output portion. The multiple internal electrodes are screen printed. The output portion is poled in the direction perpendicular to the minor faces of the output portion, preferably towards the central electrode. A longitudinal deformation of the input portions causes a deformation of the output portion in the thickness direction, which generates the output voltage across the output electrodes. A more detailed description of the construction of the input and output portions in an earlier embodiment of a similar transformer is disclosed in co-owned U.S. Pat. No. 6,326,718 to Boyd, which is hereby incorporated by reference.

Accordingly, it is an object the present invention to provide a PT of the character described that vibrates with a lower frequency and may achieve a higher gain than similar sized prior PTs It is another object of the present invention to provide a PT design that has a higher power transmission capacity than similarly sized prior PTs.

It is another object of the present invention to provide a PT of the character described that can provide isolation between the input and the output portions.

It is another object of the present invention to provide a PT of the character described that has a smaller size and a lower profile than prior PTs that have similar power transmission capacities.

It is another object of the present invention to provide a PT that has a symmetric structure which eliminates spurious bending modes which may interfere with the PTs longitudinal operation.

It is another object of the present invention to provide a PT of the character described in which the "driver" portion of the device and the "driven" portion of the device are not the same electro-active element.

It is another object of the present invention to provide a PT of the character described that develops a substantial mechanical advantage between the driver portion of the device and the driven portion of the device.

It is another object of the present invention to provide a PT of the character described that minimizes or eliminates interference between the longitudinal and thickness resonant vibrational modes.

It is another object of the present invention to provide a PT of the character described that is relatively less expensive to manufacture than prior PTs that perform comparable signal transformation functions.

It is another object of the present invention to provide a PT of the character described and that is simpler to manufacture than prior PTs having a laminate structure.

It is another object of the present invention to provide a PT that generates less heat than prior PTs, and thereby has reduced losses due to heat.

It is another object of the present invention to provide a PT that has only low voltage surfaces exposed.

It is another object of the present invention to provide a PT in which electrode connections do not cause interference with the PTs resonant vibration It is another object of the present invention to provide a PT that uses and electrode configuration that allows for more homogeneous poling of the output portions.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which:

FIG. 8 is a perspective view of the preferred multilayer construction of the output layer of the PT in FIG. 7 with the ceramic portions in ghost and using internal electrodes for the central electrode portion;

FIG. 9 is a blown up perspective view of an isolation layer and input layers of the PT in FIG. 7 showing the electrode belts and patterns;

DESCRIPTION OF THE PREFERRED EMBODIMENT

In the present invention, a laminated piezoelectric transformer is provided using the longitudinal mode resonant vibrations for step-up voltage and high power conversion applications. Typical high voltage PTs have been proposed in the past using Rosen-type PTs. In this type of PT the high voltage transformation and the power transfer is obtained by designing the input and output capacitances in a certain way. Since the transformation ratio is approximately proportional to the input to output capacitance ratio, attempts have been made to increase the input capacitance by using multilayer technology in the input portion of the PT. However, the modification of the output capacitance remain fixed for a given ceramic dimensions, since for the typical operation of the lambda-half Rosen-PT, the output section is approximately equal to half the total length of the PT. Thus, it is clear that Rosen-PT has a practical limitation on design freedom to achieve high ratios of input to output capacitances.

Furthermore, in these previous high voltage Rosen-PTs, there is an inherent power transfer limitation which limits the application of these PTs to applications requiring over 5W, such as backlighting flat panel displays (FPD), typically requiring 12W to 24W. This power transmission limitation is related to the very small coupling area between the input and the output portions of the Rosen-PT, typically the transverse area of the ceramic body in the width direction.

The present invention allows for increasing gain by increasing the capacitance ratio of the input and the output sections. In addition, the current invention provides a solution to scale-up the power levels by selecting the thickness dimensions of the input and the output layers as well as the number of layers in the input portion.

A high voltage PT is provided which has high voltage output while still providing a low profile device. A low profile device is necessary because as the ratio of the thickness to the length of a PT approaches unity, the longitudinal resonance mode and the thickness resonant mode vibrations interfere with each other. The present configuration of PT minimizes the interference of resonant modes with the following design.

Figure 1:
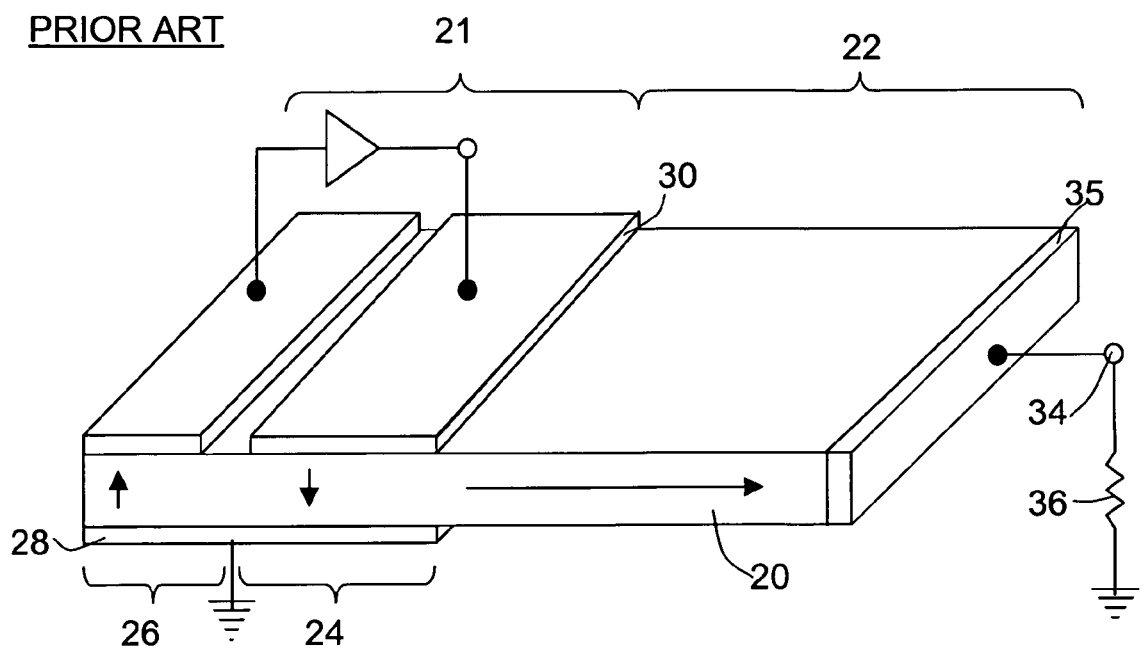
FIG. 1 is a partially schematic perspective view of a typical Rosen type piezoelectric transformer of the prior art.
Figure 2:
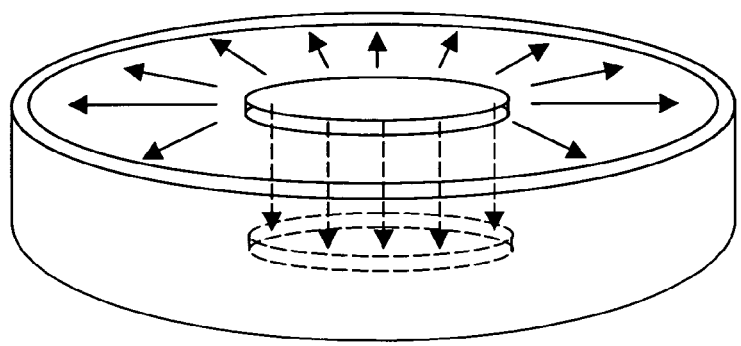
FIG. 2 is a perspective view of another example of a Rosen type piezoelectric transformer of the prior art.
Figure 3:
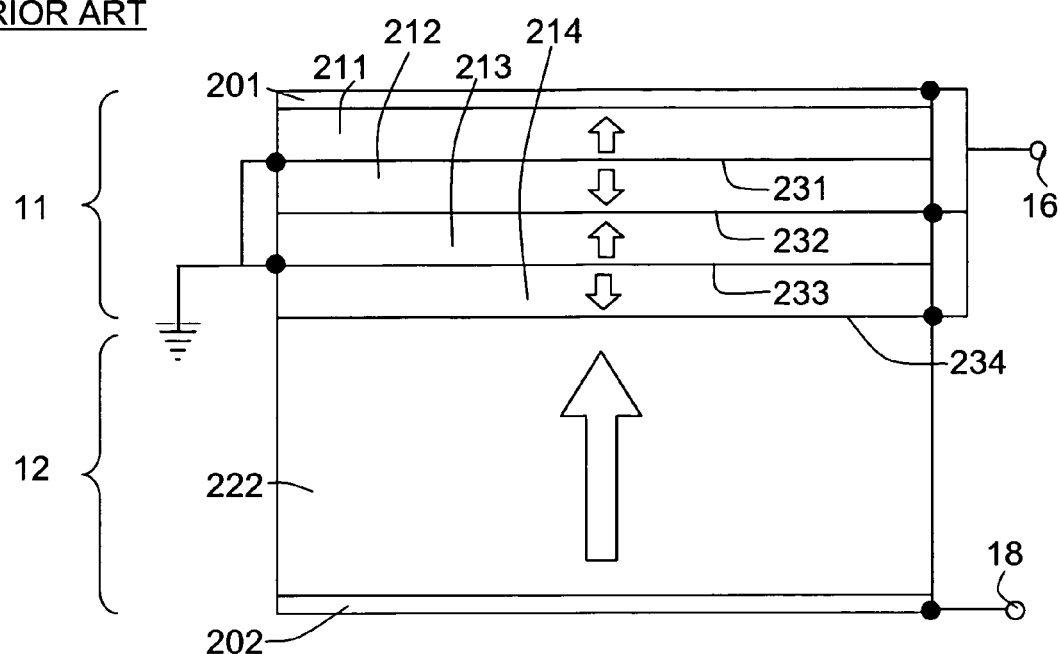
FIG. 3 is a perspective view of a typical multi-layer thickness mode vibration piezoelectric transformer of the prior art.
Figure 4:
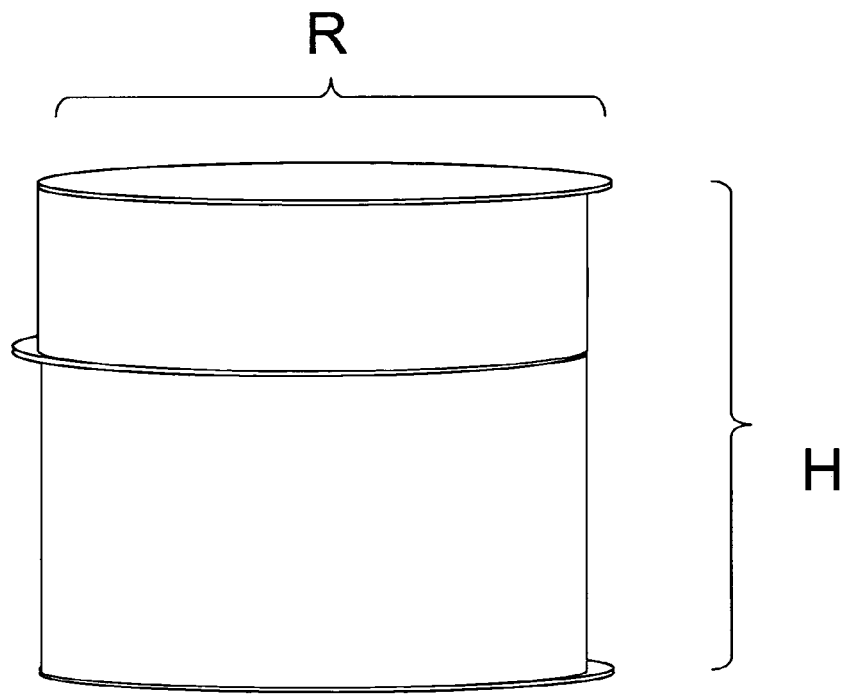
FIG. 4 is a perspective view of a cylindrical piezoelectric transformer having a radius to height ratio close to unity.
Figure 5:
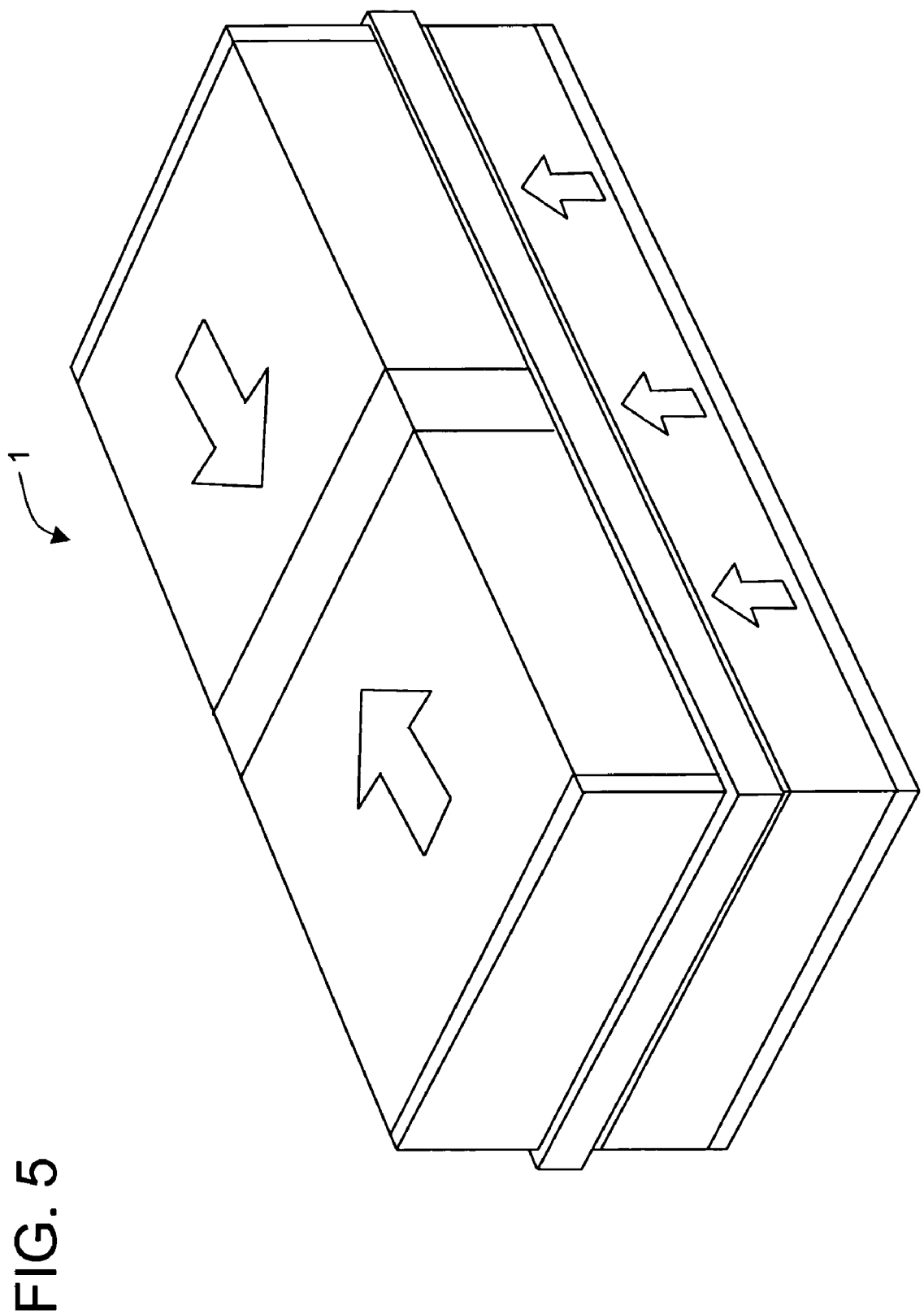
FIG. 5 is a perspective view of an early embodiment of a laminated piezoelectric transformer with a bar-shaped configuration, single output and input portions, and surface ring central electrode of the prior art.

Referring now to FIG. 5: An early embodiment of such a PT 1 comprises an input layer 60 comprising a thin layer of an electroactive material, with electrodes (silver and/or nickel) electro-deposited thereon. The input layer 60 is polarized in the thickness direction 51, and deforms along the plane orthogonal to the thickness direction. The PT 1 also comprises an output layer 40 comprising another rectangular bar-shaped layer of electroactive material. The output layer 40 is bisected by a central output electrode 45 defining two substantially equal portions 41 and 42 of the output layer 40. The output portions 41 and 42 are each poled in the longitudinal direction 52, between each outer electrode 44 and 46 towards the central electrode 45. The input layer 60 and output layer 40 are bonded to opposing sides of an insulator layer 50, which insulates the high voltage electrode 45 from the electrode 61 of the input layer 60. When the input layer 60 deforms under an applied voltage, the deformation is transmitted through the insulator layer 50 to the output layer 40, thus generating a voltage between the output ground electrodes 44 and 46 and the central high voltage electrode 45.

Figure 12:
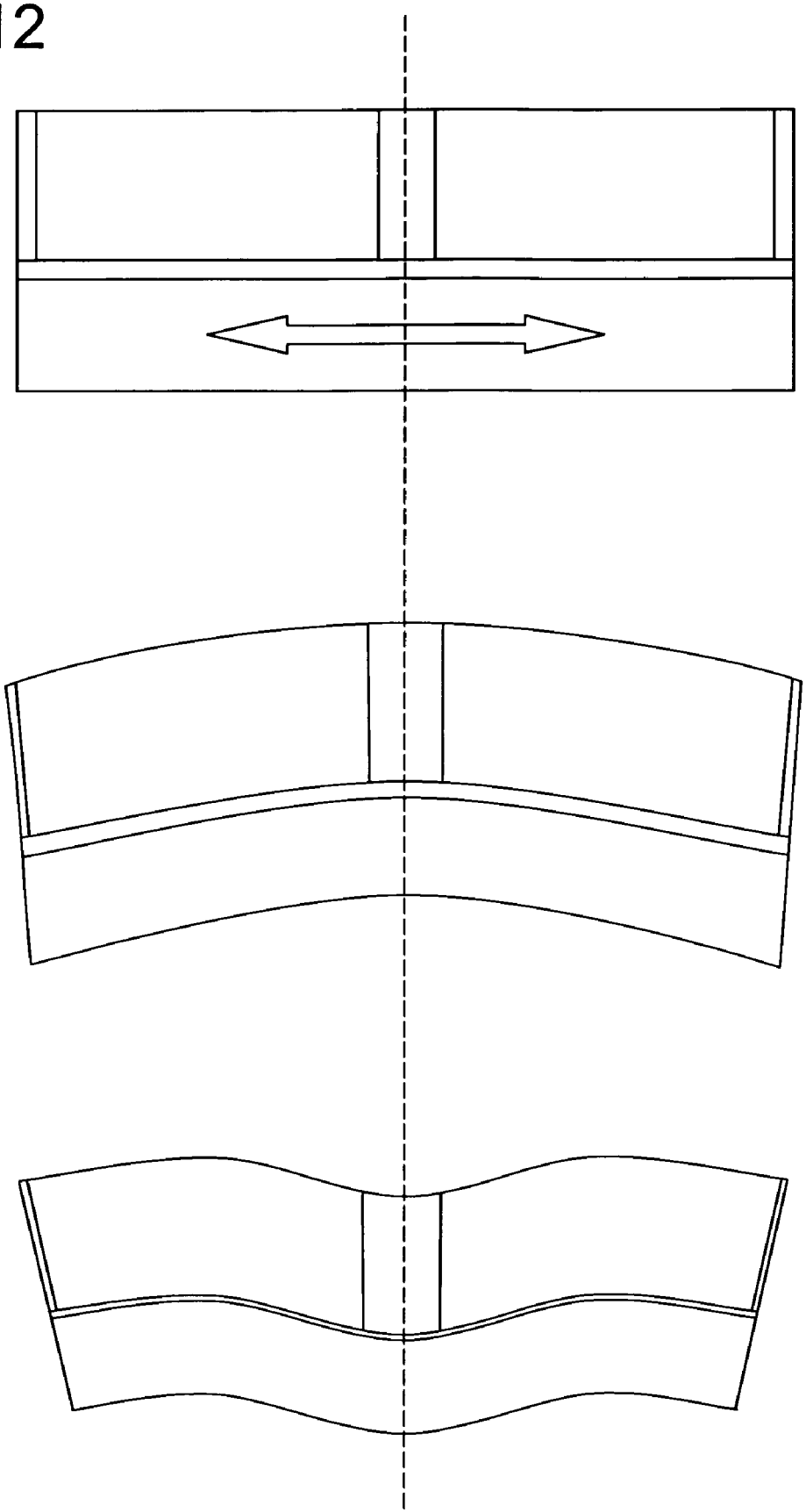
FIG. 12 is an elevation of the PT in FIG. 5 illustrating the longitudinal vibration mode, and first and second bending modes of operation.

One of the drawbacks associated with this earlier PT design is that the structure is not symmetric in the thickness direction. Because the input portion is bonded to one face of the output portion, the affect of the vibration of the input portion differs on each face of the output portion. Referring to FIG. 12: The affect of the input portion on the output portion is to cause one or more bending and torsional modes of operation (rather than the preferred longitudinal mode). The bending and torsional modes actually interfere with the main longitudinal mode, and thus diminish the performance and efficiency of the PT. FIG. 12 illustrates the first simple bending mode, and a second more complex bending mode. The frequency of the second bending mode is also very close to the frequency of the longitudinal mode, and thus may cause even greater interference with the longitudinal mode of operation of the PT.

Another drawback of the earlier design in the PT of FIG. 5 is that the bending spurious modes tends to create de-lamination of the bonding interface between input and output portion and thus resulting in the complete failure of the PT.

Another drawback of the earlier design in the PT of FIG. 5 is that polarization of the output portion is complicated. This is because the central electrode "band" is on the surfaces of the output layer. When a potential is applied between the central electrode and the outer electrodes, the polarization is mainly on the surface of the ceramic layer, which diminishes the performance of the PT. It is preferable for the polarization of the output portion between the central electrode and the outer electrodes to be uniformly and homogeneously distributed throughout the volume of the output layer. The designs of the PTs described herein below overcome the problems associated with surface poling and spurious bending/torsional modes.

Figure 6:
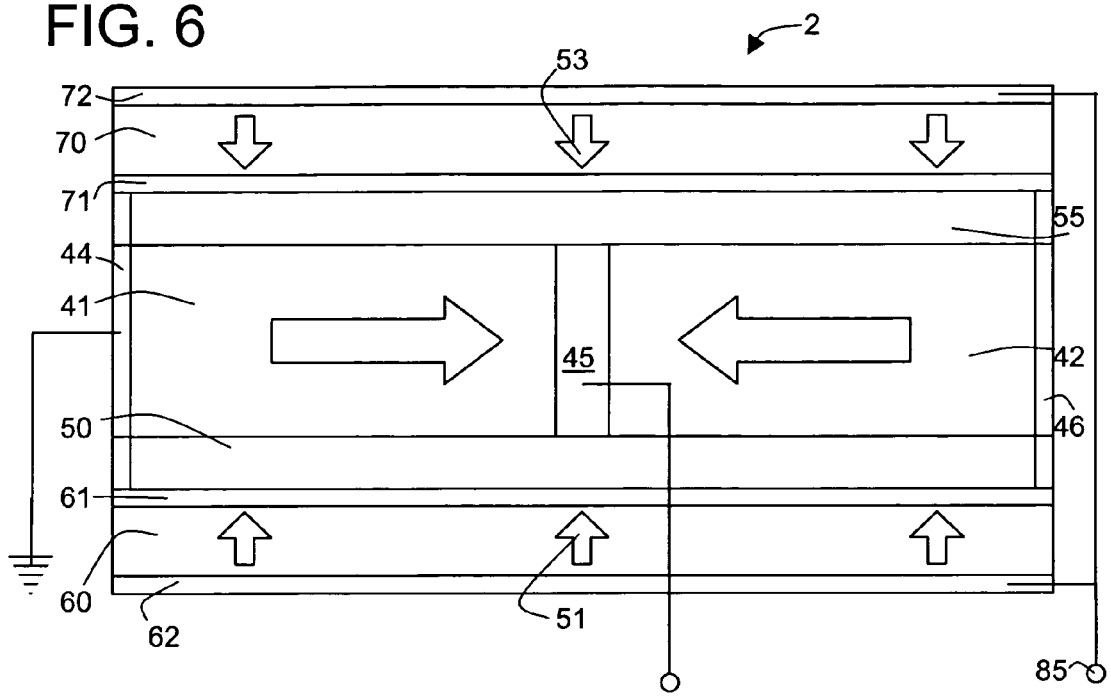
FIG. 6 is a partial schematic elevation view of the an embodiment of the laminated piezoelectric transformer showing the details of construction of an output portion bonded between two input portions, as well as preferred input and ground connections.

Referring now to FIG. 6: An improved design of such a PT 2 comprises two input layers 60 and 70 each comprising a thin layer of an electroactive material, preferably a piezoelectric material such as PZT, PZT-PSM, PZT-PZN-PSN system, PZT-PZN-PSN with different doping elements or combinations therof. Preferably, when restricted to a specified width of transformer, the input layers 60 and 70 are rectangular or bar-shaped. The input layers 60 and 70 are also preferably substantially longer than they are wide, (for example 1.5 times, and preferably 3 or more times as long), and substantially wider than it is thick (for example 1.5 or more times wider). These dimensions ensure that the device's resonant frequency is the lower frequency longitudinal mode related to the length of the device rather than to the width or thickness of the device.

Each input layer 60 and 70 has electrodes deposited on their respective major faces. Electrodes 61 and 62 are provided on the two major faces of the first input layer 60 and electrodes 71 and 72 are provided on the two major faces of the second input layer 70. The electrodes 61, 62, 71 and 72 preferably comprise a metallization of silver, platinum, palladium, copper, zinc, nickel, or combinations thereof, that are sintered with and onto each of the major faces of the input layers 60 and 70. Alternately, the electrodes 61, 62, 71 and 72 may be screen printed, vapor deposited or mechanically bonded to each face of the ceramic layers 60 and 70. Where a bonding is used, the electrodes 61, 62, 71 and 72 preferably each comprise a foil layer of copper, zinc, nickel, silver, platinum or combinations thereof. Bonding of the input layers 60 and 70 to the electrodes 61, 62, 71 and 72 is preferably achieved with an ARALDITE-type single component epoxy-based adhesive such as "AV-118" (AV118) manufactured by Vantico, Inc., a division of Ciba Specialty Chemicals Corporation, N.A. of East Lansing, Mich., or similar epoxies such as "Ciba-Geigy AV118" (AV118) manufactured by the same or similar epoxies such as Eccobond G909 manufactured by Emerson and Cuming, of Canton, Mass.

Each of the input layers 60 and 70 is polarized in the thickness direction, i.e., in a direction perpendicular to the input electrodes 61 and 62, 71 and 72 on the major faces of the respective input layers 60 and 70 as indicated by arrows 51 and 53. This polarization is such that when a voltage is applied across the input electrodes 61 and 62, the first input layer 60 will deform in the longitudinal direction, i.e., a d31 mode deformation in a direction parallel to the planes of electrodes 61 and 62, and primarily along the longer dimension (length) in that plane. Also, when a voltage is applied across the input electrodes 71 and 72, the second input layer 70 will deform in the longitudinal direction, i.e., a d31 mode deformation in a direction parallel to the planes of electrodes 71 and 72, and primarily along the longer dimension (length) in that plane.

Figure 7:
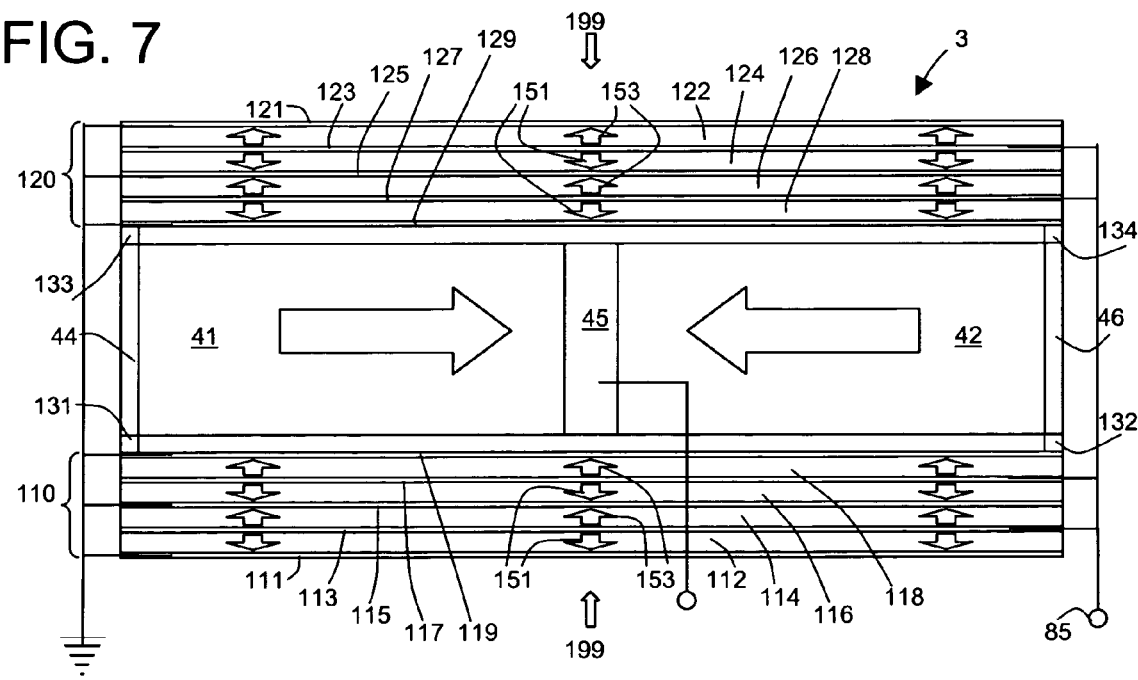
FIG. 7 is a partial schematic elevation view of the preferred embodiment of a piezoelectric transformer using two multilayer input portions and showing the preferred input and ground connections.

Referring to FIGS. 7 and 8: The output layer 40 of the PT 3 comprises another rectangular bar-shaped layer of electroactive material, preferably PZT. The electroactive material if the output portion 40 may also comprise a piezoelectric material such as PZT, PZT-PSM, PZT-PZN-PSN, and PZT-PZN-PSN with different doping elements or combinations thereof. Preferably, the thickness of the output layer 40 is relatively greater than the thickness of the input layer 60. The output layer 40 is bisected by a central output electrode section 45 thus defining two substantially equal portions 41 and 42 of the output layer 40. In one embodiment of the invention, the output layer 40 comprises a single bar of PZT with a central electrode section 45 comprising a band 45a bonded to and/or wrapped around the central circumferential surface of the bar. However, the output layer 40 may alternatively comprises two separate pieces 41 and 42 of PZT which are bonded at a minor face to the central electrode section 45 which is in the form of a metallic sheet or electrode plate. Two outboard output electrodes 44 and 46 are bonded on the two minor faces of the output layer 40 that are parallel to the central electrode section 45. The electrodes 44, 45 and 46 preferably comprise copper foil bonded to the output layer 40 using AV118 adhesive.

Referring again to FIG. 8: However, in the preferred embodiment of the invention, the central electrode section 45 comprises not only a circumferential band 45a, but also one or more internal electrodes 45b–g. The internal electrodes 45b–g may be manufactured by screen printing metallizations as described hereinabove about the centers of multiple ceramic tapes, which are then sintered together to form a unitary block of PZT having internal electrodes 45b–g along the interior of the ceramic in the central electrode section 45 of the output layer 40. The advantage of having a band 45a and internal electrodes 45b–g, is in the poling process for the output portions 41 and 42. For a simple band 45a without internal electrodes 45b–g, as poling voltages are applied between outer electrodes 44 and 46, and electrode section 45, the poling of the output portions 41 and 42 is primarily at the surface of the output portions 41 and 42. With the additional internal electrodes 45b–g, the output sections 41 and 42 are poled more homogeneously throughout the ceramic layer 40 due to the relative greater ease of travel of the voltage from the outer electrodes 44 and 46 to the center electrodes 45a–g. The homogeneous poling of the output sections 41 and 42 allows greater voltages to be generated and increases the overall efficiency of the PT 2.

Referring again to FIG. 6: The output layer 40 is also bonded, preferably using AV118 adhesive on each major face to the remaining major faces of the insulating layers 50 and 55. Thus, in the preferred embodiment of the invention, the central electrode section 45 is essentially a conductive band 45a that wraps around the output layer 40 between the output portions 41 and 42 with or without underlying internal electrodes 45b–g, and in the alternative embodiment of the invention the central electrode 45 actually physically separates the two output portions 41 and 42 of the output layer 40 from each other.

Each portion 41 and 42 of the output layer 40 is preferably polarized between its respective outboard electrode 44 or 46 towards the central electrode section 45. This provides for an output layer 40 with output portions 41 and 42 that are poled longitudinally (parallel to the major face) with respect to the input layers 60 and 70. The output portions 41 and 42 are actually poled in the thickness direction with respect to the poling direction between their respective output electrodes 44 and 45 or 46 and 45. The output portions 41 and 42 are preferably both poled towards the central output electrode 45 as indicated by arrows 52, i.e., the positive poling potential is applied at the central electrode 45. With this poling, when a voltage is applied between electrodes 44 and 45 or between electrodes 46 and 45, the output portion 41 or 42 between those electrodes will expand or contract (depending on the polarity) between the electrodes and parallel to the direction of poling (d33 deformation). Conversely, when the output portions 41 and 42 of the output layer 40 are strained under a compressive or tensile force, a voltage is generated between the output electrodes 44 and 45 and electrodes 45 and 46. It is also possible to polarize each portion 41 and 42 from the central electrode toward its respective electrode 44 or 46.

The PT 2 also comprises first and second insulator layers 50 and 55 bonded to each major face of the output layer 40, as well as to a major face of each input layer 60 and 70. The insulator layers 50 and 55 each preferably comprises a layer of alumina or silica glass, i.e., dielectrics having a low dielectric constant, preferably ∈<10. As illustrated in FIG. 6, an electrode 61 or 62 of the input layer 60 is bonded to a face of the first insulating layer 50, and an electrode 61 or 72 of the input layer 70 is bonded to a face of the second insulating layer 50, each preferably using AV118 adhesive. The alumina layers 50 and 55 prevent the input electrodes 61 or 62, 71 or 72 from contacting any of the high voltage central output electrode section 45. The insulator layers 50 and 55 extend to the edges of the input electrodes 61 or 62, 71 or 72 to which they are bonded.

Referring again to FIG. 6: In the preferred embodiment of the PT 2, the outboard input electrodes 62 and 72 are connected to an input terminal 65. The input electrodes 61 and 71 bonded to the insulators 50 and 55 are connected to ground as are the outboard output electrodes 44 and 46. Output electrode 45 is connected to output terminal 47. In order to simplify the ground connections, the output ground electrodes 44 and 46 preferably are electrically in contact with the ground input electrode 61 and 71. This may be accomplished by having a conductor extending from the output ground electrodes 44 and 46 to the input ground electrodes 61 and 71. In one embodiment this may be facilitated using insulator layers 50 and 55 that extend only as far as the output ground electrodes 44 and 46, and extending the length of the output ground electrodes 44 and 46 to contact the input ground electrodes 61 and 71 respectively. In a preferred embodiment, common ground connections may be facilitated using insulator layers 50 and 55 that extend out to the output ground electrodes 44 and 46, and have a metallic conductor bonded to each end between the output ground electrodes 44 and 46 to contact the input ground electrodes 61 and 71.

In operation, application of a voltage of a first polarity to input terminal 65 across the electrodes 61 and 62 of the input layer 60 causes a longitudinal d31 deformation (contraction) of the ceramic layer 60, which in turn deforms (contracts) the attached insulator layer 50 and output layer 40. Likewise, application of a voltage of a first polarity to input terminal 65 across the electrodes 71 and 72 of the input layer 70 causes a longitudinal d31 deformation (contraction) of the ceramic layer 70, which in turn deforms (contracts) the attached insulator layer 55 and output layer 40. The thickness deformation (contraction) of the output portions 41 and 42 of the output layer 40 piezoelectrically generates an output voltage of a first polarity in the g33 mode, between the grounded output electrodes 44 and 46 and the central output electrode section 45, which is connected to output terminal 47. Conversely, application of a second voltage of a second opposite polarity to input terminal 65 across the electrodes 61 and 62, and 71 and 72 of the respective input layers 60 and 70 causes a longitudinal d31 mode deformation (expansion) of the ceramic layers 60 and 70, which in turn deforms (expands) the attached insulator layers 50 and 55 and output layer 40. The thickness deformation (expansion) of the output portions 41 and 42 of the output layer 40 piezoelectrically generates an output voltage of a second opposite polarity in the g33 mode, between the grounded output electrodes 44 and 46 and the central output electrode section 45, which is connected to output terminal 47. Thus, application of an alternating voltage to the input layers 60 and 70 causes the input layers 60 and 70 to deform (in the d31 mode), which causes the attached insulator layers 50 and 55 and output layer 40 to deform (in the g33 mode), thereby generating an alternating output voltage.

Referring to FIGS. 7–10: The most preferred embodiment of a PT 3 is illustrated showing an improved design to the input portions 110 and 120 as well as to the ground connections. This PT 3 has an output layer 40 as described hereinabove and detailed in FIG. 8, comprising a bar of electroactive material having two outer ground electrodes 44 and 46 as well as a central high voltage electrode section 45 comprising an outer band 45a and internal electrodes 45b–g. The improvement in the PT 3 lies in using a multilayer construction for the input portions 110 and 120 as well as an electrode configuration for the ground connections for the input 110 and 120 and output portions 40.

Referring again to FIGS. 7 and 9: The input portions 110 and 120 comprise a plurality of individual input layers. More specifically, input portion 110 preferably comprises four thin input layers 112, 114, 116 and 118 of an electroactive material. Also, input portion 120 preferably comprises four thin input layers 122, 124, 126 and 128 of an electroactive material. Preferably, the electroactive material if the input portions 110 and 120 comprises a piezoelectric material such as PZT, PZT-PSM, PZT-PZN-PSN, and PZT-PZN-PSN with different doping elements or combinations thereof. Preferably, when restricted to a specified width of transformer, the input layers 110 and 120 are rectangular or bar-shaped rather than circular in order to take advantage of the lower resonant frequency longitudinal mode. The input portions 110 and 120 are also preferably substantially longer than they are wide, (for example 1.5 times, and preferably 3 or more times as long), and substantially wider than it is thick (for example 1.5 or more times wider). These dimensions ensure that the device's resonant frequency is the lower frequency longitudinal mode related to the length of the device rather than to the width or thickness of the device.

Each input layer 112, 114, 116 and 118, and 122, 124, 126 and 128 of respective input portions 110 and 120 has electrodes deposited on their respective major faces. More specifically, input layer 112 has electrodes 111 and 113 deposited on it major faces. Electrode 113 contacts a major face of layer 114, and electrode 115 is deposited on the opposite major face of layer 115. Electrode 115 contacts a major face of layer 116, and electrode 117 is deposited on the opposite major face of layer 116. Electrode 117 contacts a major face of layer 116, and electrode 119 is deposited on the opposite major face of layer 118. Likewise, in the second input portion: input layer 122 has electrodes 121 and 123 deposited on it major faces; electrode 123 contacts a major face of layer 124, and electrode 125 is deposited on the opposite major face of layer 125; electrode 125 contacts a major face of layer 126, and electrode 127 is deposited on the opposite major face of layer 126; and electrode 127 contacts a major face of layer 126, and electrode 129 is deposited on the opposite major face of layer 128.

The electrodes 111, 113, 115, 117 and 119, and 112, 123, 125, 127 and 129 preferably comprise a metallization of silver, platinum, palladium, copper, zinc, nickel, or combinations thereof, that are sintered with and onto each of the major faces of the input layers 112, 114, 116 and 118, and 122, 124, 126 and 128 of respective input portions 110 and 120. Alternately, the electrodes 111, 113, 115, 117 and 119, and 112, 123, 125, 127 and 129 may be screen printed, vapor deposited or mechanically bonded to each respective face of the ceramic layers 112, 114, 116 and 118, and 122, 124, 126 and 128. Where a bonding is used, the electrodes 111, 113, 115, 117 and 119, and 112, 123, 125, 127 and 129 preferably each comprise a foil layer of copper, zinc, nickel, silver, platinum or combinations thereof. Bonding of the input layers 112, 114, 116 and 118, and 122, 124, 126 and 128 to the electrodes 111, 113, 115, 117 and 119, and 112, 123, 125, 127 and 129 is preferably achieved with an ARALDITE-type single component epoxy-based such as "AV-118" (AV118) manufactured by Vantico, Inc., a division of Ciba Specialty Chemicals Corporation, N.A. of East Lansing, Mich., or similar epoxies such as Eccobond G909 manufactured by Emerson and Cuming, of Canton, Mass.

Each of the input layers 112, 114, 116 and 118, and 122, 124, 126 and 128 of respective input portions 110 and 120 is polarized in the thickness direction, i.e., in a direction perpendicular to the input electrodes 111, 113, 115, 117 and 119, and 112, 123, 125, 127 and 129 on the major faces of the respective input layers 112, 114, 116 and 118, and 122, 124, 126 and 128 indicated by arrows 151 and 153. In the preferred embodiment of the invention, the direction of poling 151 or 153, alternates at each input layer 112, 114, 116 and 118, and 122, 124, 126 and 128 of respective input portions 110 and 120. Also, in the preferred embodiment, each electrode 111, 113, 115, 117 and 119, and 112, 123, 125, 127 and 129 is preferably alternatingly connected to ground or the input voltage. Most preferably, the ground electrodes are the outside electrodes 111, 115 and 119, and 121, 125 and 129, and the input voltage is applied to electrodes 113, 117, 123 and 127. The electrode connections and polarization is such that when a voltage is applied across input electrodes 111 and 113, for example, the input layer 112 deforms in the longitudinal direction, i.e., a d31 mode deformation in a direction parallel to the planes of electrodes 111 and 113, and primarily along the longer dimension (length) in that plane. Likewise, when a voltage is applied across the input electrodes 121 and 123, input layer 122 will deform in the longitudinal direction, i.e., a d31 mode deformation in a direction parallel to the planes of electrodes 121 and 123, and primarily along the longer dimension (length) in that plane. The alternate poling of the layers and alternating connection of the input and ground electrodes ensures that all input layers deform in the same direction, i.e. expand or contract simultaneously.

Figure 10:
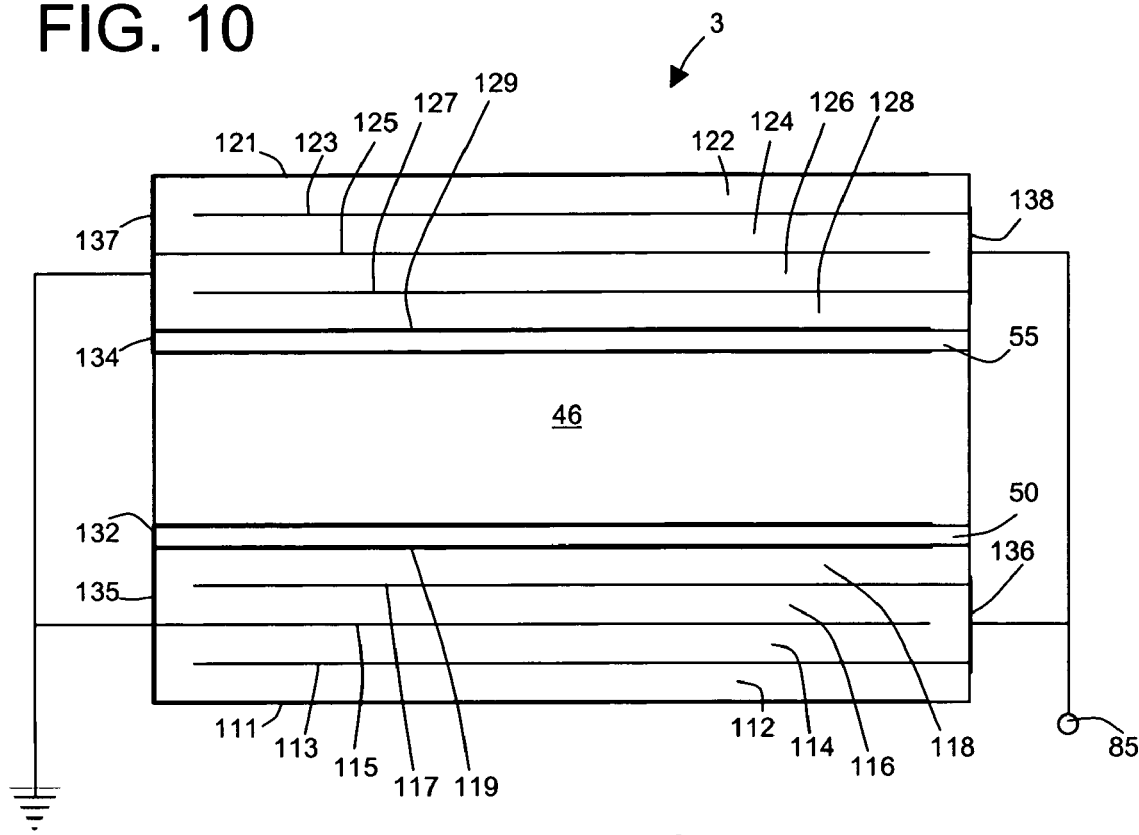
FIG. 10 is a partial schematic elevation view of the PT of FIG. 7 showing the interdigitation of the input electrodes and common ground connection through belt electrodes.
Figure 11:
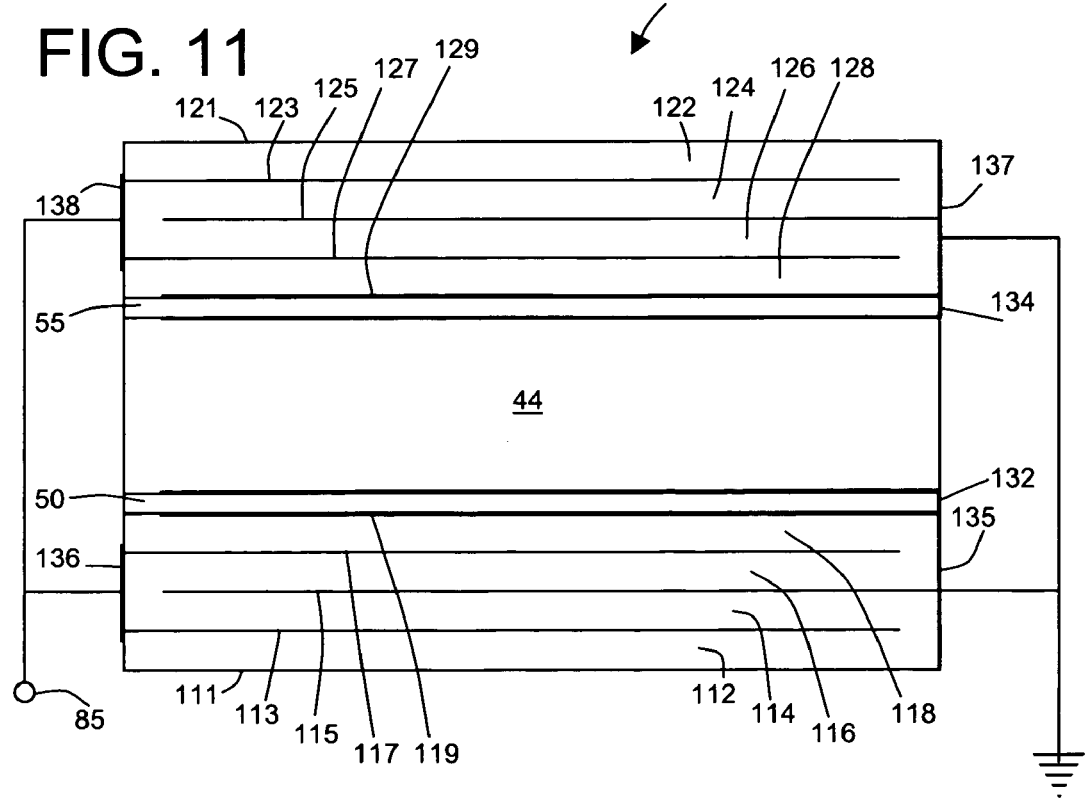
FIG. 11 is a partial schematic elevation view of the PT of FIG. 10 as viewed from the opposite side showing the interdigitation of the input electrodes and common ground connection through belt electrodes.

Referring now to FIGS. 9–11: To facilitate the application of a voltage across the layers of the input portions 110 and 120, the electrodes in each input portion 110 and 120 are preferably interdigitated. More specifically, when constructing an input portion 110, such as in FIG. 9, each ceramic layer 112, 114, 116 and 118 comprises a thin tape of piezoelectric material. Electrodes 111, 113, 115, 117 and 119 comprising metallizations are screen printed on each layer 112, 114, 116 and 118 in a preferred pattern to provide interdigitation. Specifically, layers 112 and 116 have electrodes 113 and 117 respectively applied to the majority of their inboard major faces (the faces closest to the output portion 40), extending from a first edge (along the length dimension) and leaving a blank strip 112a and 116a of unelectroded ceramic along the second edge of the ceramic layers 112 and 116. Conversely, layers 114 and 118 have electrodes 115 and 119 respectively applied to the majority of their inboard major faces (the faces closest to the output portion 40), extending from the second edge (along the length dimension) and leaving a blank strip 114a and 118a of unelectroded ceramic along the first edge of the ceramic layers 114 and 118. Input ceramic layer 112 also has an electrode 111 applied to the majority of the outboard major face (the face furthest from the output portion 40), extending from the second edge (along the length dimension) and leaving a blank strip 112b of unelectroded ceramic along the first edge of the ceramic layer 112. These ceramic layers 112, 114, 116 and 118 are then sintered together to form a unitary multilayer input portion 110 having interdigitated electrodes 111, 113, 115, 117 and 119.

Referring again to FIGS. 9–11: To facilitate the simultaneous application of an input voltage, as well as provide ground connections for the input and output portions 110, 120 and 40, "belt" type electrodes are used both on the input portions 110 and 120 and the insulator layers 50 and 55. As shown in FIGS. 10 and 11, an input ground belt electrode 140 is formed on the first input portion 110 by the outermost electrodes 111 and 119 and side ground electrode 135 printed on the longitudinal side to which electrode 111, 115 and 119 extend. The side ground electrode 135 electrically connects electrodes 111, 115 and 119 to ground. An input electrode 136 printed on the opposite side of the input portion 110 connects interior input electrode 113 and 117 to the input terminal 85. Likewise, a second input ground belt electrode 141 is formed on the second input portion 120 by the outermost electrodes 121 and 129 and side ground electrode 137 printed on the longitudinal side to which electrode 121, 125 and 129 extend. The side ground electrode 137 electrically connects electrodes 121, 125 and 129 to ground. A second input electrode 138 printed on the opposite side of the second input portion 120 connects interior input electrode 123 and 127 to the input terminal 85.

Each insulator layer 50 and 55 also has "belt" type electrodes. More specifically, as shown in FIG. 9, insulator layer 50 has two belt electrodes 131 and 132 bonded or printed on each end. Each insulator belt electrode 131 and 132 comprises a band of conductive material printed along the edge of insulator layer 50 on the inboard face (adjacent the output portion 40 and output electrode 44 or 46, then along one side of the insulator 50, and along the outboard face (adjacent input ground electrode 119). Preferably, the width of each insulator belt electrode 131 and 132 is substantially equal to the width of the adjacent respective output ground electrode 44 and 46, but may be made thinner as long as there is still electrical contact between the input electrode 119, the belt electrodes 131 and 132 and the output ground electrodes 44 and 46. The insulator belt electrodes may also be wider so long as they do not contact the central output electrode band 45a. Preferably, each belt electrode 131 and 132 extends along the edge of the inboard and outboard faces of the insulator layer 50 with a length substantially equal to and coincident with the length of the adjacent input ground electrode 119. Insulator layer 55 also has belt electrodes 133 and 134 constructed in a like manner to place input ground electrode 129 in electrical contact with output ground electrodes 44 and 46.

Thus, input portion 110 has a belt electrode substantially covering the inboard and outboard faces and one side to electrically connect electrodes 119, 115, and 111 to ground. Likewise, input portion 120 has a belt electrode substantially covering the inboard and outboard faces and one side to electrically connect electrodes 129, 125, and 121 to ground. Further more, insulator belt electrodes 131 and 132 connect the output ground electrodes 44 and 46 to the input ground electrodes 119, 115 and 111. Likewise, insulator belt electrodes 133 and 133 connect the output ground electrodes 44 and 46 to the input ground electrodes 129, 125 and 121.

Thus, by the use of belt electrodes 131, 132, 133 and 134 all input and output ground electrodes may be electrically connected to a common ground. This is desirable because it reduces the number of connection points for electrodes, which are historically the point of failure for vibrating devices. The use of the belt electrode for the input portions 110 and 120 also places ground electrodes on the majority of the outboard surfaces of the transformer 3, and thus minimizes the area and associated risks of exposed high voltage electrodes.

Furthermore, because of the design of the belt electrodes, the contact point(s) of the input, output and ground terminals may be made along the center of the transformer 3. Because the transformer 3 is a vibrating device, electrode connections tend to fail if connected to an area subject to vibration. The central axis of the transformer (along output electrode section 45) is a node about which the oscillation of the transformer 3 takes place. Because each electrode is printed to pass across the central axis of vibration of the transformer 3, input, output and ground connections may be made to an area subject to little or no vibration, thus increasing durability and minimizing the risk of failure.

A double 4-layer-input transformer 3 was constructed as in FIGS. 7–11. The transformer 3 delivered more than twice the power levels of the transformer 2 of FIG. 5 which is limited to less than 5W. Dimensions of this transformer 3 were 21.25×7.7×4.5 mm3 (V=0.74 cm3), with a total weight of 4.8 gram. Power density of this transformer 3 under 100–200 kohms load was over 13W/cm3 with efficiency demonstrated over 94% in the final samples. The mass of this transformer 3 is only 0.6 grams more than the transformer 2 of FIG. 5, which is 4.2 grams. This transformer 3 has been made to operate under DC bus levels of 15 to 20V with a step-up ratio on the order of 80 under a load of 200Kohms. With a 15 vdc input, the output voltage of 1500V under levels of power of 10W were measured with increase in the temperature lower than 25° C.

While the above description contains many specificities, these should not be construed as limitations on the scope of the invention, but rather as exemplification of preferred embodiments thereof. Many other variations are possible, for example:

While in the preferred embodiment of the invention the ceramic layers are preferably constructed of a PZT ceramic material, other electroactive materials may be used in its place;

The ceramic layers can be piezoelectric, ferroelectric or other electroactive elements;

The input portion may comprise as few as one ceramic layer or may be of a multi-layer construction;

The shape of the PT need not be rectangular bar-shaped, and many other shapes or configurations are possible;

The direction of polarization of the input layers can vary and need not be toward the central electrode, but may be away from the central electrode or combinations thereof;

The direction of polarization of the output layer need not be toward the central electrode, but may be away the central electrode;

The central electrode of the output layer need not be the high voltage electrode—the outer electrodes may carry the high voltage and the central electrode may be ground referenced;

The insulating layer need not be constructed of alumina, but may be constructed of other insulating materials.

The insulating layer need not extend to the edges or past the edges, but may simply be large enough to isolate the high voltage electrode from the input or ground electrodes.

Accordingly, the scope of the invention should be determined not by the embodiment illustrated, but by the appended claims and their legal equivalents.

I claim:

1. A piezoelectric transformer, comprising:
a first input portion comprising a first electroactive layer having first and second opposing electroded major faces and first and second opposing minor faces and polarized such that upon application of voltage across said first and second opposing electroded major faces, said first electroactive layer deforms in a longitudinal direction parallel to said first and second opposing electroded major faces and perpendicular to said first and second opposing minor faces;
a second input portion comprising a second electroactive layer having first and second opposing electroded major faces and first and second opposing minor faces and polarized such that upon application of voltage across said first and second opposing electroded major faces, said second electroactive layer deforms in a longitudinal direction parallel to said first and second opposing electroded major faces and perpendicular to said first and second opposing minor faces;
an output electroactive layer having first and second opposing major faces, first and second opposing electroded minor faces, third and fourth opposing minor faces;
said output electroactive layer having a central output electrode portion between said first and second opposing electroded minor faces;
said output electroactive layer having a first output portion between said central output electrode portion and said first electroded minor face, said first output portion being polarized in a direction normal to said first electroded minor face;
said output electroactive layer having a second output portion between said central output electrode portion and said second electroded minor face, said second output portion being polarized in a direction normal to said second electroded minor face; and
a first dielectric layer having first and second opposing major faces;
said first major face of said first dielectric layer being bonded to said first electroded major face of said first input electroactive layer;
said second major face of said first dielectric layer being bonded to said first major face of said output electroactive layer;
a second dielectric layer having first and second opposing major faces;
said first major face of said second dielectric layer being bonded to said first electroded major face of said second input electroactive layer;
said second major face of said dielectric layer being bonded to said second major face of said output electroactive layer;
wherein upon application of a voltage across said first and second electroded major faces of said first input electroactive layer, said first input portion deforms in said longitudinal direction;
and wherein upon application of a voltage across said first and second electroded major faces of said second input electroactive layer, said second input portion deforms in said longitudinal direction;
and wherein upon said longitudinal deformation of said first and second input portions, said first and second bonded dielectric layers and said bonded output electroactive layer mechanically strain in said longitudinal direction;
and wherein said mechanical strain of said bonded output electroactive layer in said longitudinal direction piezoelectrically generates a first output voltage between said first electroded minor face and said central output electrode portion and a second output voltage between said second electroded minor face and said central output electrode portion.

2. The piezoelectric transformer of claim 1,
wherein said direction of poling of said first output portion is opposite said direction of poling of said second output portion.

3. The piezoelectric transformer of claim 2,
wherein said central output electrode portion comprises an electrode layer substantially bisecting said output electroactive layer in a plane parallel to said first and second electroded minor faces.

4. The piezoelectric transformer of claim 2, wherein said central output electrode portion comprises:

a conductive band encircling a portion of said output electroactive layer on said first and second opposing major faces and said third and fourth minor faces, said encircled portion being substantially equidistant from each of said first and second electroded minor faces; and at least one internal electrode within said output electroactive layer and said encircled portion, said at least one internal electrode being substantially parallel to said first and second electroded minor faces.

5. The piezoelectric transformer of claim 4, further comprising:

means for applying a first voltage of a first polarity across said first and second input portions, wherein application of said first voltage deforms said first and second input portions in a first direction parallel to said longitudinal direction; and means for applying a second voltage having a second polarity opposite said first polarity across said first and second input portions, wherein application of said second voltage deforms said first and second input portions in a second opposite direction parallel to said longitudinal direction.

6. The piezoelectric transformer of claim 4, wherein said first input portion comprises:

a first plurality of input electroactive layers each having first and second opposing major faces and polarized such that upon application of a voltage across said first and second opposing major faces, each of said input electroactive layers in said first plurality of input electroactive layers deforms in said longitudinal direction parallel to each of said first and second opposing major faces;

a first plurality of ground electrodes bonded between alternate input electroactive layers in said first plurality of input electroactive layers; and a first plurality of input voltage electrodes bonded between alternate input electroactive layers in said first plurality of input electroactive layers;

wherein each of said input voltage electrodes are on an opposite major face of each input electroactive layer with respect to said major face to which each of said ground electrodes is bonded;

and wherein a first electroded major face of said first input portion is bonded to said first dielectric layer electroactive layer.

7. The piezoelectric transformer of claim 6, wherein said second input portion comprises:

a second plurality of input electroactive layers each having first and second opposing major faces and polarized such that upon application of a voltage across said first and second opposing major faces, each of said input electroactive layers in said second plurality of input electroactive layers deforms in said longitudinal direction parallel to each of said first and second opposing major faces;

a second plurality of ground electrodes bonded between alternate input electroactive layers in said second plurality of input electroactive layers; and a second plurality of input voltage electrodes bonded between alternate input electroactive layers in said second plurality of input electroactive layers;

wherein each of said input voltage electrodes are on an opposite major face of each input electroactive layer with respect to said major face to which each of said ground electrodes is bonded;

and wherein a first electroded major face of said second input portion is bonded to said second dielectric layer electroactive layer.

8. The piezoelectric transformer of claim 6:

wherein said first input portion has third and fourth minor faces;

and wherein each of said ground electrodes in said first plurality of ground electrodes contacts said third minor face and extends toward and in proximity to said fourth minor face, but does not contact said fourth minor face;

and wherein each of said input voltage electrodes in said first plurality of input voltage electrodes contacts said fourth minor face and extends toward and in proximity to said third minor face, but does not contact said third minor face.

9. The piezoelectric transformer of claim 8:

wherein said second input portion has third and fourth minor faces;

and wherein each of said ground electrodes in said second plurality of ground electrodes contacts said third minor face and extends toward and in proximity to said fourth minor face, but does not contact said fourth minor face;

and wherein each of said input voltage electrodes in said second plurality of input voltage electrodes contacts said fourth minor face and extends toward and in proximity to said third minor face, but does not contact said third minor face.

10. The piezoelectric transformer of claim 9, further comprising:

a first common ground terminal extending across at least a portion of said third minor face of said first input portion;

said first common ground terminal being in electrical contact with each of said ground electrodes in said first plurality of ground electrodes;

a first common input voltage terminal extending across at least a portion of said fourth minor face of said first input portion;

said first common input voltage terminal being in electrical contact with each of said input voltage electrodes in said first plurality of input voltage electrodes;

a second common ground terminal extending across at least a portion of said third minor face of said second input portion;

said second common ground terminal being in electrical contact with each of said ground electrodes in said second plurality of ground electrodes; and a second common input voltage terminal extending across at least a portion of said fourth minor face of said second input portion;

said second common input voltage terminal being in electrical contact with each of said input voltage electrodes in said second plurality of input voltage electrodes.

11. The piezoelectric transformer of claim 10:

wherein each of said input electroactive layers in said first plurality of input electroactive layers is polarized in a thickness direction normal to each of said first and second opposing major faces;

said direction of polarization of each of said input electroactive layers being towards said bonded ground electrode in said first plurality of ground electrodes.

12. The piezoelectric transformer of claim 11:

wherein each of said input electroactive layers in said second plurality of input electroactive layers is polarized in a thickness direction normal to each of said first and second opposing major faces;

said direction of polarization of each of said input electroactive layers being towards said bonded ground electrode in said second plurality of ground electrodes.

13. The piezoelectric transformer of claim 12, wherein said first input portion further comprises:

a first plurality of input electroactive layers having first and second exterior major faces, and third and fourth exterior minor faces;

said first plurality of input electroactive layers being an even number of input electroactive layers;

and wherein said first common ground terminal comprises a first belt electrode substantially covering said first major face, said third minor face, and said second major face of said first input portion.

14. The piezoelectric transformer of claim 13, wherein said second input portion further comprises:

a second plurality of input electroactive layers having first and second exterior major faces, and third and fourth exterior minor faces;

said second plurality of input electroactive layers being an even number of input electroactive layers;

and wherein said second common ground terminal comprises a second belt electrode substantially covering said first major face, said third minor face, and said second major face of said second input portion.

15. The piezoelectric transformer of claim 14;

wherein said first electroded minor face of said output portion comprises a first output ground electrode;

and wherein said second electroded minor face of said output portion comprises a second output ground electrode;

wherein said first dielectric layer has first and second major faces and first and second minor faces;

said first minor face of said first dielectric layer being adjacent said third minor face of said first input portion and said first output ground electrode;

said second minor face of said first dielectric layer being adjacent said fourth minor face of said first input portion and said second output ground electrode;

and wherein said piezoelectric transformer further comprises first and second dielectric layer belt electrodes;

said first dielectric layer belt electrode comprising a first conductive band encircling at least a portion of said first and second major faces of said first dielectric layer adjacent said first minor face of said first dielectric layer;

said first dielectric layer belt electrode being in electrical contact with said first common ground terminal of said first input portion and said first output ground electrode;

said second dielectric layer belt electrode comprising a second conductive band encircling at least a portion of said first and second major faces of said first dielectric layer adjacent said second minor face of said first dielectric layer;

said second dielectric layer belt electrode being in electrical contact with said first common ground terminal of said first input portion and said second output ground electrode.

16. The piezoelectric transformer of claim 15;

wherein said second dielectric layer has first and second major faces and first and second minor faces;

said first minor face of said second dielectric layer being adjacent said third minor face of said second input portion and said first output ground electrode;

said second minor face of said second dielectric layer being adjacent said fourth minor face of said second input portion and said second output ground electrode;

and wherein said piezoelectric transformer further comprises third and fourth dielectric layer belt electrodes;

said third dielectric layer belt electrode comprising a third conductive band encircling at least a portion of said first and second major faces of said second dielectric layer adjacent said first minor face of said second dielectric layer;

said third dielectric layer belt electrode being in electrical contact with said first common ground terminal of said second input portion and said first output ground electrode;

said fourth dielectric layer belt electrode comprising a fourth conductive band encircling at least a portion of said first and second major faces of said second dielectric layer adjacent said second minor face of said second dielectric layer;

said fourth dielectric layer belt electrode being in electrical contact with said first common ground terminal of said second input portion and said second output ground electrode.

17. The piezoelectric transformer of claim 16, further comprising:

means for applying a first voltage of a first polarity across said first input portion and said second input portion, wherein application of said first voltage deforms said first input portion and said second input portion in a first direction parallel to said longitudinal direction; and means for applying a second voltage having a second polarity opposite said first polarity across said first input portion and said second input portion, wherein application of said second voltage deforms said first input portion and said second input portion in a second opposite direction parallel to said longitudinal direction;

and wherein said deformation of first and second input portions in said first and second directions deforms said attached first and second dielectric layers;

and wherein said deformation of first and second dielectric layers in said first and second directions deforms said attached output portion in said first and second directions;

whereby said deformation of said output portion in said first and second directions generates an oscillating voltage between said central output electrode portion and each of said electroded minor faces.

* * * * *